United States Patent [19]

Ishihara

[11] Patent Number: 5,162,671
[45] Date of Patent: Nov. 10, 1992

[54] SCHMITT VOLTAGE COMPARATOR

[75] Inventor: Ichiro Ishihara, Tokyo, Japan

[73] Assignee: Kabushiki Kaisha Toshiba, Kawasaki, Japan

[21] Appl. No.: 641,919

[22] Filed: Jan. 16, 1991

[30] Foreign Application Priority Data

Jan. 19, 1990 [JP] Japan .................................. 2-9561

[51] Int. Cl.$^5$ ............ H03K 5/153; H03K 3/29; H03K 5/22; H03F 3/45
[52] U.S. Cl. .................... 307/362; 307/290; 307/495; 330/253
[58] Field of Search ............. 330/253; 307/362, 359, 307/290, 495

[56] References Cited

U.S. PATENT DOCUMENTS 3,725,673  4/1973  Frederiksen et al. ............... 307/362

Primary Examiner—Eugene R. LaRoche
Assistant Examiner—Evelyn A. Lester
Attorney, Agent, or Firm—Finnegan, Henderson, Farabow, Garrett and Dunner

[57] ABSTRACT

A differential amplifier pair includes first and second transistors emitters of which are connected to each other. A first current source is connected to a common emitter connection point of the first and second transistors. A source of a first MOS transistor is connected to a collector of the first transistor, and a source of a second MOS transistor is connected to a collector of the second transistor. Drains of the first and second MOS transistors are commonly connected to each other, and a second current source is connected to a common drain connection point. The first and second MOS transistors are selectively controlled to be turned on in accordance with an output from the differential amplifier pair.

12 Claims, 5 Drawing Sheets

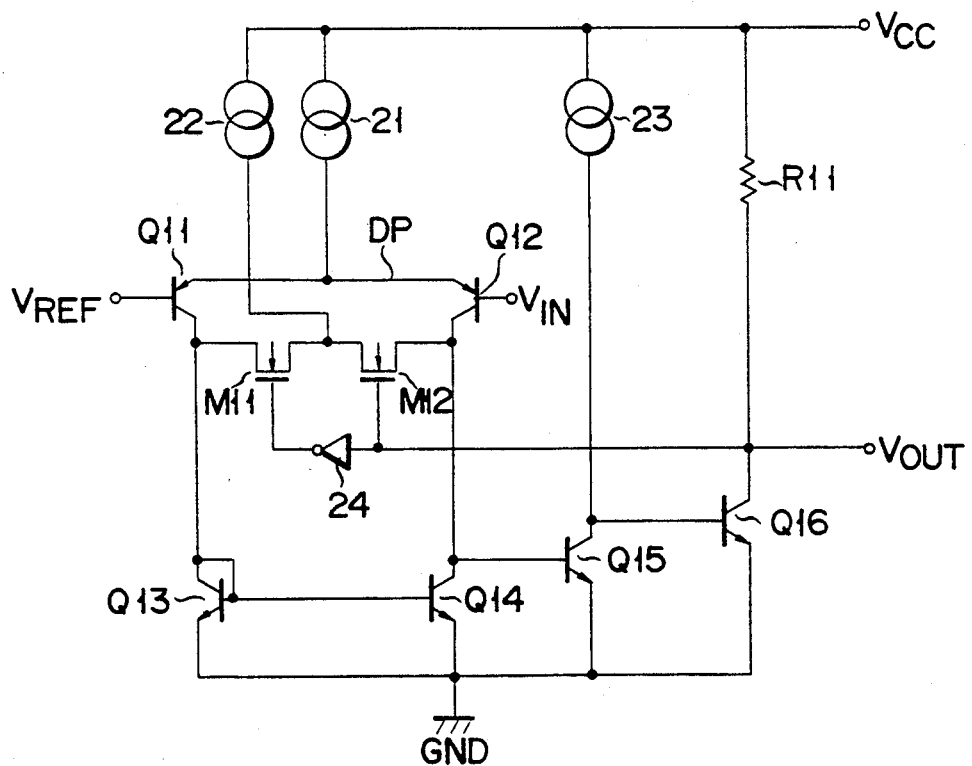
F I G. 2

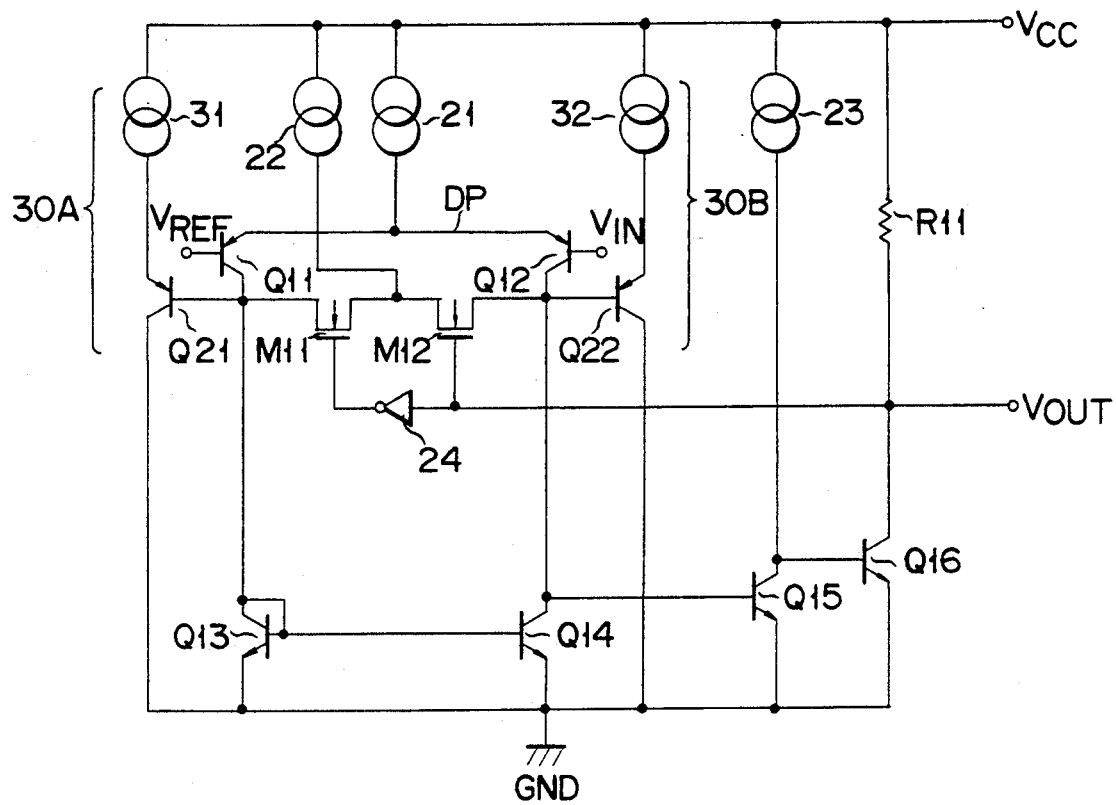
F I G. 5

SCHMITT VOLTAGE COMPARATOR

BACKGROUND OF THE INVENTION

1. Field of the Invention

The present invention relates to a voltage comparator and, more particularly, to a Schmitt voltage comparator.

2. Description of the Related Art

FIG. 1 is a circuit diagram showing a conventional Schmitt voltage comparator. Referring to FIG. 1, reference symbols Q1 and Q2 denote pnp transistors constituting a pair of differential amplifiers emitters of which are commonly connected to each other. Reference numeral 11 denotes a first constant current source connected between a power source having a voltage $V_{CC}$ and the common connection point of the emitters of the transistors Q1 and Q2. Reference symbol Q3 denotes an npn transistor a collector and an emitter of which are connected between the collector of the transistor Q1 and a ground voltage GND and a collector and a base of which are connected to each other. Reference symbol Q4 denotes an npn transistor a collector and an emitter of which are connected between the collector of the transistor Q2 and the GND and a base of which is connected to the base of the transistor Q3. Reference symbols R1 to R3 denote resistors connected in series between a power source having a reference voltage $V_{REF}$ and a power source having the ground voltage GND. The series connection point of the resistors R1 and R2 is connected to the base of the transistor Q1 as one of the transistors Q1 and Q2. Reference symbol Q5 is an npn transistor a base of which is connected to the collector of the transistor Q4 and an emitter of which is connected to the GND. Reference numeral 12 denotes a second constant current source connected between the power source having the voltage $V_{CC}$ and the collector of the transistor Q5. Reference symbol Q6 denotes an npn transistor a base of which is connected to the collector of the transistor Q5 and an emitter of which is connected to the power source of GND. Reference symbol R4 denotes a resistor connected between the power source having the voltage $V_{CC}$ and the collector of the transistor Q6. Reference symbol Q7 denotes an npn bias switching transistor a collector of which is connected to the series connection point of the resistors R2 and R3, an emitter of which is connected to the ground voltage of GND, and a base of which is connected to the base of the transistor Q6. An output voltage $V_{OUT}$ is extracted from the collector of the transistor Q6.

In the above voltage comparator, a threshold level $V_{THU}$ of an input voltage $V_{IN}$ at a rise time applied to the base of the other transistor Q2 selected from the transistors Q1 and Q2 is expressed by the following equation:

$$V_{THU} = \frac{R2 + R3}{R1 + R2 + R3} \times V_{REF} \qquad 1$$

A threshold level $V_{THD}$ of the input voltage $V_{IN}$ at a fall time is expressed by the following equation:

$$V_{THD} = \frac{R2(R3//R_{SAT})}{R1 + R2 + (R3//R_{SAT})} \times V_{REF} \qquad 2$$

where $R_{SAT}$ denotes an ON resistance (collector-emitter saturation resistance) of the bias switching transistor Q7 and $R3//R_{SAT}$ denotes a resistance of the resistors R3 and $R_{SAT}$. Since the resistance of the resistor $R_{SAT}$ is very low, equation 2 can be simplified as follows.

$$V_{THD} = \frac{R2}{R1 + R2} \times V_{REF} \qquad 3$$

Therefore, a Schmitt width is defined by a voltage width between the voltages $V_{THU}$ and $V_{REF}$.

However, in order to decrease the Schmitt width, a term including the resistance $R_{SAT}$ always has an error, and this error cannot be neglected. Design for the circuit becomes difficult.

SUMMARY OF THE INVENTION

It is, therefore, an object of the present invention to provide a Schmitt voltage comparator capable of accurately setting a Schmitt width to be small a simple circuit arrangement.

According to the present invention, there is provided a voltage comparator comprising a differential amplifier pair including first and second transistors emitters of which are connected to each other and bases of which receive an input voltage and a reference voltage, a first constant current source connected to a connection point of emitters of the first and second transistors, a first switching element one terminal of which is connected to a collector of the first transistor, a second switching element one terminal of which is connected to a collector of the second transistor and other terminal of which is connected to other terminal of the first switching element, a second constant current source connected to a connection point of the other terminal of the first switching element and the other terminal of the second switching element, and control means for selectively controlling the first and second switching elements to be turned on in accordance with an output from the differential amplifier pair.

BRIEF DESCRIPTION OF THE DRAWINGS

FIG. 2 is a circuit diagram showing a voltage comparator according to the first embodiment of the present invention;

FIG. 5 is a circuit diagram showing a voltage comparator according to the second embodiment of the present invention;

DETAILED DESCRIPTION OF THE PREFERRED EMBODIMENTS

Figure 1:
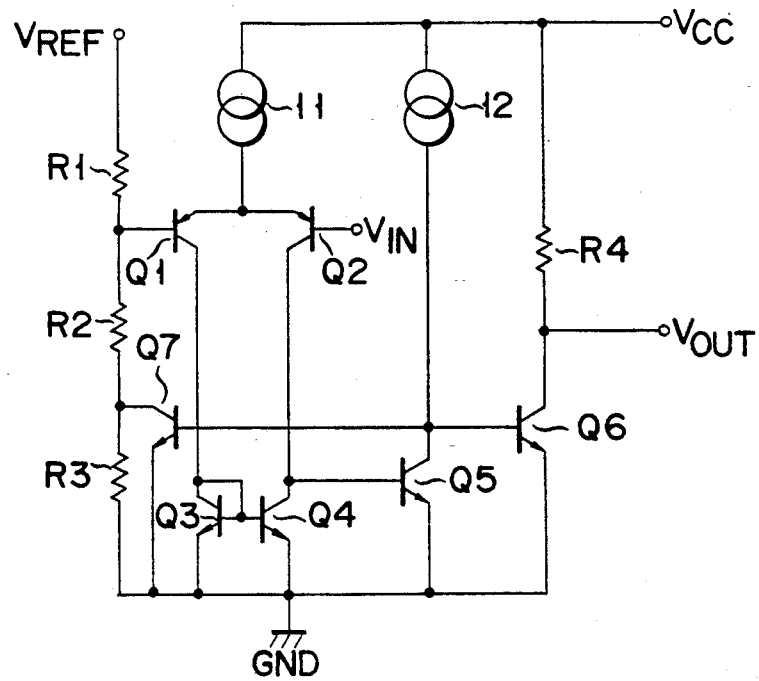
FIG. 1 is a circuit diagram showing a conventional circuit.

An embodiment of the present invention will be described below with reference to the accompanying drawings.

FIG. 2 is a circuit diagram showing an integrated Schmitt voltage comparator according a first preferred embodiment of to the present invention. Referring to FIG. 2, emitters of pnp transistors Q11 and Q12 are connected to each other, and a reference voltage $V_{REF}$ and an input voltage $V_{IN}$ are applied to the bases of the transistors. The transistors Q11 and Q12 are constituting a differential amplifier pair DP.

One terminal of a first constant current source 21 having a current value I1 is connected to the common connection point of the emitters of the transistors Q11 and Q12. The other terminal of the constant current source 21 is connected to a power source having a voltage $V_{CC}$ which is a positive polarity value.

The collector and base of an npn transistor Q13 are connected to the collector of the transistor Q11. The emitter of the transistor Q13 is connected to the power source of a ground voltage GND having a value of 0 V. The collector of an npn transistor Q14 is connected to the collector of the transistor Q12. The base of the npn transistor Q14 is connected to the base of the transistor Q13, and the emitter of the transistor Q14 is connected to the power source of the GND.

A differential amplifier is constituted by the pnp transistors Q11 and Q12, the npn transistors Q13 and 14, and the constant current source 21. The source of an n-channel MOS transistor M11 is connected to the collector of the transistor Q11. The source of an n-channel MOS transistor M12 is connected to the collector of the transistor Q12. The drains of the MOS transistors M11 and M12 are connected to each other. One terminal of a second constant current source 22 having a current value I2 is connected to the common connection point of the drains of the MOS transistors M11 and M12. The other terminal of the constant current source 22 is connected to a source having a voltage $V_{CC}$. Note that the current value I1 of the first constant current source 21 and the current value I2 of the constant current source 22 satisfy a relationship of $I1 \leq I2$.

The base of an npn transistor Q15 is connected to the collector of the transistor Q12. The emitter of the transistor Q15 is connected to the source of the ground voltage GND. One terminal of a third constant current source 23 is connected to the collector of the transistor Q15. The other terminal of the constant current source 23 is connected to the power source of the voltage $V_{CC}$.

The base of an npn transistor Q16 is connected to the collector of the transistor Q15. The emitter of the transistor Q16 is connected to the power source of the ground voltage GND. One terminal of a load resistor R11 is connected to the collector of the transistor Q16. The other terminal of the load resistor R11 is connected to the power source of the voltage $V_{CC}$. An output voltage $V_{OUT}$ is extracted from the connection point between the collector of the transistor Q16 and the load resistor R11.

The output voltage $V_{OUT}$ is directly input to the gate of the MOS transistor M12. The output voltage $V_{OUT}$ is input to the gate of the MOS transistor M11 through an inventer 24. Note that a buffer amplifier for amplifying an output from the differential amplifier is constituted by the transistors Q15 and Q16, the constant current source 23, and the load resistor R11.

Figure 3:
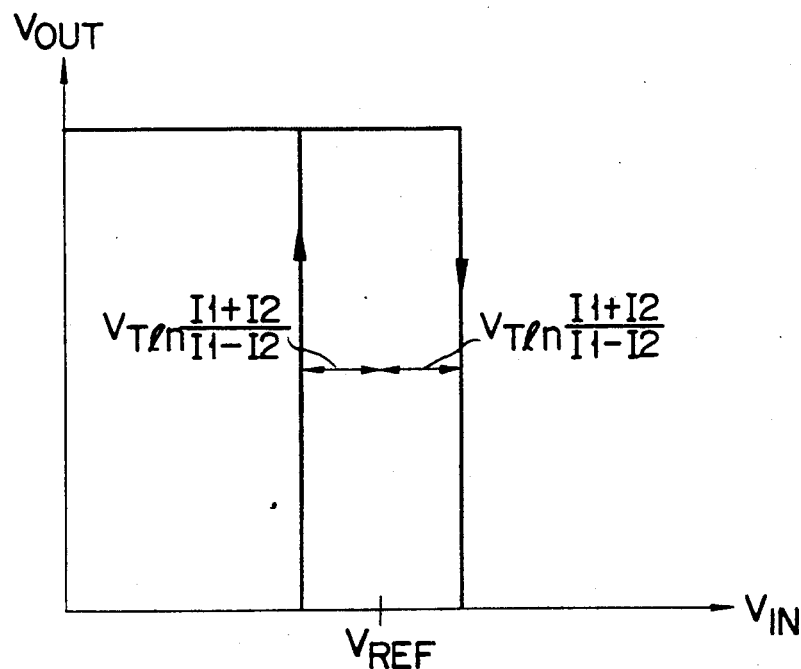
FIG. 3 is a graph showing an operation of the circuit according to the first embodiment.

An operation of the voltage comparator will be described with reference to input/output characteristics shown in FIG. 3. When the reference voltage $V_{REF}$ is fixed at a predetermined voltage and the input voltage $V_{IN}$ is gradually increased from a voltage lower than the reference voltage $V_{REF}$, if the voltage $V_{IN}$ is lower than the voltage $V_{REF}$, the transistor Q12 is turned on, and the transistor Q11 is turned off. At the same time, the transistors Q13 and Q14 are turned off, the transistor Q15 is turned on, and the transistor Q16 is turned off. Therefore, the output voltage $V_{OUT}$ goes to "H" level. At this time, the MOS transistor M12 is turned on, and the transistor M11 is turned off. For this reason, the current I2 from the second constant current source 22 is supplied to the collector of the transistor Q12 through the MOS transistor M12.

In this state, when the value of the input voltage $V_{IN}$ is gradually increased, and the voltage is higher than the reference voltage $V_{REF}$, the transistor Q11 is turned on, and the transistor Q12 is turned off. In addition, the transistors Q13 and Q14 are turned on, the transistor Q15 is turned off, and the transistor Q16 is inverted into the ON state. Therefore, the output voltage $V_{OUT}$ is inverted into an "L" level state. Thus, the MOS transistor M11 is turned on, the MOS transistor M12 is turned off, and the current I2 from the second constant current source 22 is supplied to the collector of the transistor Q11 through the MOS transistor M11.

In this case, for the sake of descriptive simplicity, it is assumed that a current amplification factor hfe is infinite, the output voltage $V_{OUT}$ is inverted when a value of a current supplied to the transistor Q13 is equal to that of a current supplied to the transistor Q14. At this time, when a collector current supplied to the transistor Q12 is represented by Ix, the relationship between the current Ix and the currents I1 and I2 is expressed by the following equations:

$$Ix + I2 = I1 - Ix \qquad (3)$$

$$\therefore Ix = (I1 - I2)/2 \qquad (5)$$

For this reason $I1 > I2$ must be satisfied as described above.

Therefore, a collector current $I_{Q11}$ supplied to the transistor Q11 and a collector current $I_{Q12}$ supplied to the transistor Q12 are respectively expressed by the following equations:

$$I_{Q11} = (I1 + I2)/2 \qquad (6)$$

$$I_{Q12} = (I1 = I2)/2 \qquad (7)$$

The base voltage ($V_{IN}$) of the transistor Q12 is equal to the value obtained as follows. A base-emitter voltage $V_{BEQ11}$ of the transistor Q11 is added to the reference voltage $V_{REF}$, and a base-emitter voltage $V_{BEQ12}$ is subtracted from the resultant value. That is, the voltage $V_{IN}$ is given by the following equation 8:

$$V_{IN} = V_{REF} + V_{BEQ11} - V_{BEQ12} \qquad (8)$$

In this case, when the value $V_T \ln \cdot Ic/Is$, (Ic represents a collector current, Is represents a reverse saturation current) and equations 6 and 7 are substituted in the voltages $V_{BEQ11}$ and $V_{BEQ12}$, a threshold level (inverted level) $V_{THU}$ of the input voltage $V_{IN}$ obtained when the output voltage $V_{THU}$ goes from "H" level to "L" level (in other words, the input voltage $V_{IN}$ is switched from "L" level to "H" level) is given as the following equation:

$$V_{THU} = V_{REF} + V_T \ln \cdot \frac{I1 + I2}{2 \cdot Is} - V_T \ln \cdot \frac{I1 - I2}{2 \cdot Is} \qquad 9$$

$$= V_{REF} + V_T \ln \cdot \frac{I1 + I2}{I1 - I2}$$

where Is is a reverse saturation current of the transistors Q11 and Q12.

Contrary to this, when the output voltage $V_{OUT}$ is set at an "L" level, the value of the input voltage $V_{IN}$ is gradually decreased. When the input voltage $V_{IN}$ is set to be lower than the reference voltage $V_{REF}$, the transistor Q12 is turned on, and the transistor Q11 is turned off. In addition, the transistors Q13 and Q14 are turned off, the transistor Q15 is turned on, and the transistor Q16 is inverted into an OFF state. The output voltage $V_{OUT}$ is inverted into an "H" level state again. At this time, collector currents $I_{Q11}$ and $I_{Q12}$ respectively supplied to the transistors Q11 and Q12 are expressed by the following equations:

$$I_{Q11} = (I1 - I2)/2 \qquad (10)$$

$$I_{Q12} = (I1 + I2)/2 \qquad (11)$$

A threshold level $V_{THD}$ of the input voltage $V_{IN}$ obtained when the output voltage $V_{OUT}$ is switched from "L" level to "H" level (in other words, the input voltage $V_{IN}$ is switched from "H" level to "L" level) is given by the following equation:

$$V_{THD} = V_{REF} + V_T \ln \cdot \frac{I1 - I2}{2 \cdot Is} - V_T \ln \cdot \frac{I1 + I2}{2 \cdot Is} \qquad 12$$

$$= V_{REF} + V_T \ln \cdot \frac{I1 - I2}{I1 + I2}$$

$$= V_{REF} - V_T \ln \cdot \frac{I1 + I2}{I1 - I2}$$

That is, according to the above voltage comparator, the Schmitt width is $\pm V_T \ln\{(I1+I2)/(I1-I2)\} = 2 \cdot V_T \ln\{I1+I2)/(I1/-I2)\}$ with respect to the reference voltage $V_{REF}$, and the value of the current from the second constant current source 22 can be changed to arbitrarily set the Schmitt width. Therefore, when the Schmitt width is to be decreased, it can be accurately set. In addition, the effect as described above can be obtained by a simple circuit arrangement which is obtained such that two MOS transistors M11 and M12, one constant current source 22, and one inverter 24 are added to a conventional voltage comparator.

Figure 4:
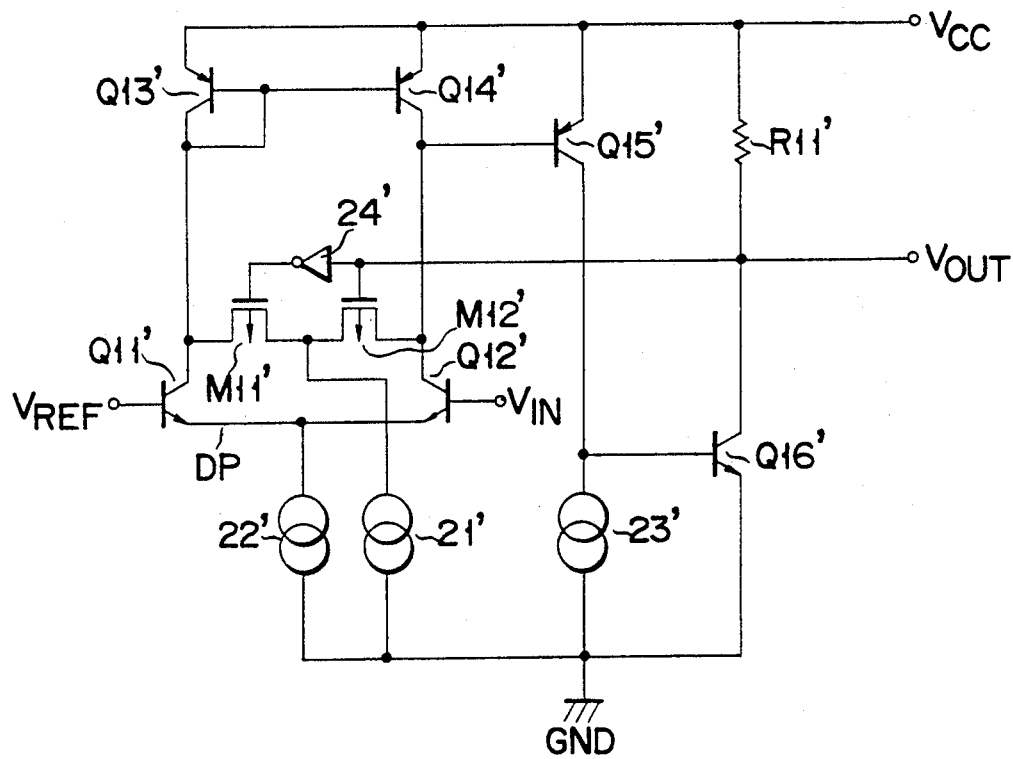
FIG. 4 is a circuit diagram showing a modification of the circuit according to the first embodiment.

A modification of the comparator according to the above embodiment will be described below. In the above embodiment, pnp transistors are used as the transistors Q11 and Q12, npn transistors are used as the transistors Q13, Q14, Q15, and Q16, and n-channel transistors are used as the MOS transistors M11 and M12. However, in the comparator of the embodiment in FIG. 2, the following voltage comparator shown in FIG. 4 can be used. That is, the pnp transistor may be replaced by an npn transistor, the npn transistor may be replaced by a npn transistor, and the n-channel MOS transistor may be replaced by a p-channel MOS transistor. A junction relationship of the MOS transistor to the power source $V_{CC}$ and the GND power source is reversed. Note that, marks' are added to parts in FIG. 4 corresponding to the parts in FIG. 2.

In a conventional integrated circuit, transistors each having a lateral structure are used as pnp transistors Q11 and Q12 for constituting a differential amplifier pair DP. However, since the transistor having a lateral structure has a small current amplitude factor hfe, a current error corresponding to a base current occurs between the collector and emitter currents in each of the transistors Q11 and Q12. When the current error is increased, errors in the above equation 5 and the subsequent equations are also increased.

In order to prevent the occurrence of errors, according to the second embodiment of the present invention, correction circuits 30A and 30B are provided to supply a current corresponding to base currents of the pnp transistors Q11 and Q12 constituting a differential amplifier pair to the collector of the voltage comparator shown in FIG. 2 so as to correct errors.

The correction circuits 30A and 30B comprise pnp transistors Q21 and Q22 having the same size as the pnp transistors Q11 and Q12 for constituting the differential amplifier pair and two constant current sources 31 and 32 for supplying a current having the same magnitude as that of the first constant current source 21. That is, one terminal of the constant current source 31 is connected to the emitter of the pnp transistor Q21, and the other terminal is connected to the above power source $V_{CC}$. The base of the pnp transistor Q21 is connected to the collector of the pnp transistor Q11, and the collector of the transistor Q21 is connected to a power source of GND. Similarly, one terminal of the constant current source 32 is connected to the emitter of the pnp transistor Q22, and the other terminal is connected to the above power source $V_{CC}$. The base of the pnp transistor Q22 is connected to the collector of the pnp transistor Q12, and the collector of the transistor Q22 is connected to the power source of GND.

With the above arrangement, currents corresponding to base currents supplied from the emitters of the transistors Q11 and Q12 to their bases are supplied from the emitters of the transistors Q21 and Q22 to the collectors of the transistors Q11 and Q12. Therefore, current errors corresponding to the base currents of the pnp transistors Q11 and Q12 are corrected.

Figure 6:
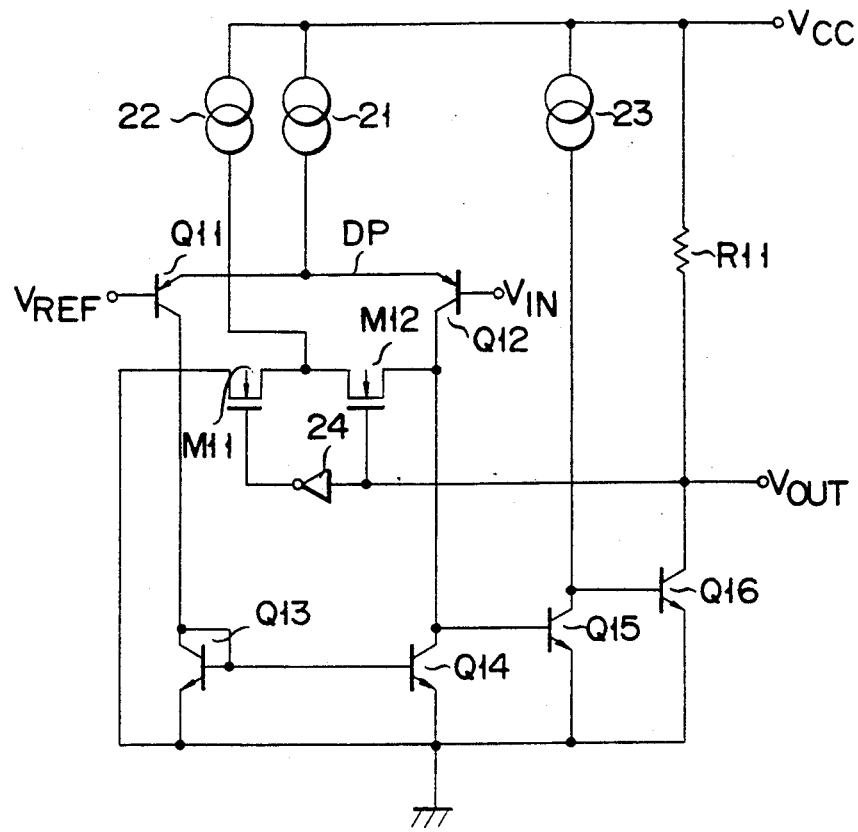
FIG. 6 is a circuit diagram showing a voltage comparator according to the third embodiment of the present invention.

The third embodiment of the present invention will be described below with reference to FIG. 6. In the voltage comparator in FIG. 6, the source of the MOS transistor M11 of the voltage comparator shown in FIG. 2 is not connected to the collector of the transistor Q11 but the power source of GND.

Figure 7:
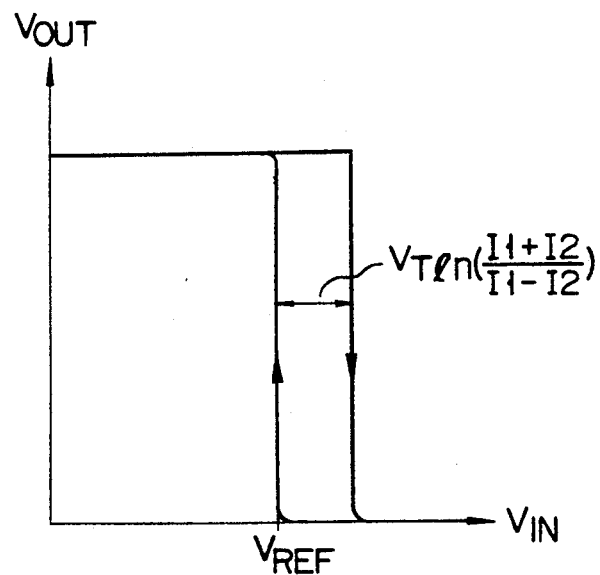
FIG. 7 is a graph showing an operation of the circuit according to the third embodiment.

With the above arrangement, as input/output characteristics shown in FIG. 7, a threshold level $V_{THD}$ of an input voltage $V_{IN}$ when the input voltage $V_{IN}$ is switched from "H" level to "L" level is equal to a reference voltage $V_{REF}$. Therefore, in the circuit in this embodiment, a Schmitt width of $\pm V_T \ln\{(I1+I2)/(I1-I2)\}$ can be obtained with respect to the reference voltage $V_{REF}$.

Figure 8:
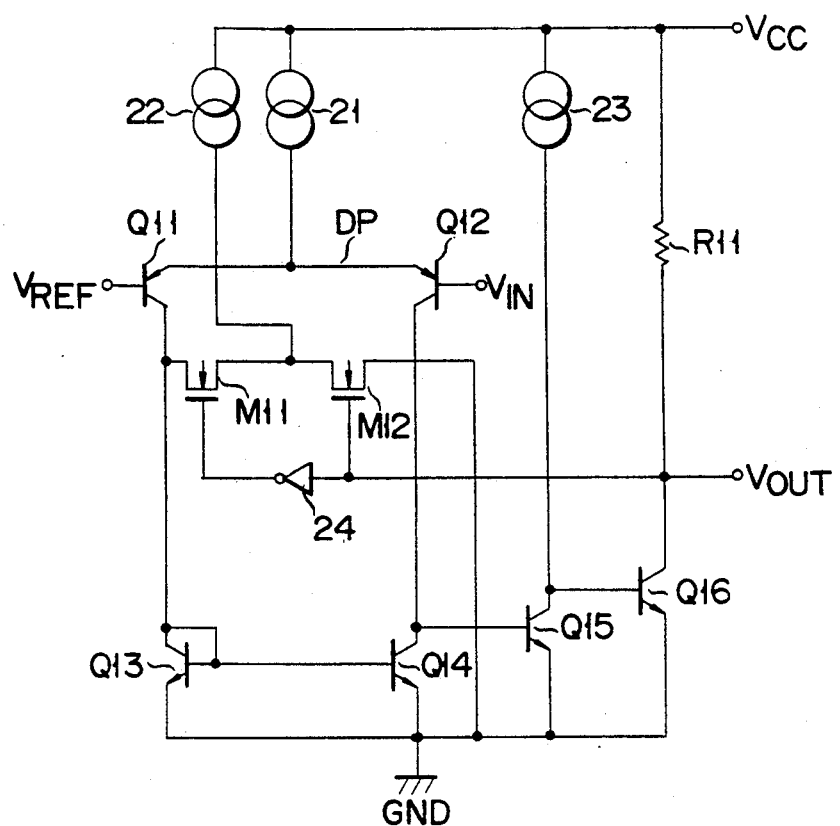
FIG. 8 is a circuit diagram showing a voltage comparator according to the fourth embodiment of the present invention.

The fourth embodiment of the present invention will be described below with reference to FIG. 8. In the voltage comparator of this embodiment, in contrast to the voltage comparator shown in FIG. 6, the source of the MOS transistor M12 is not connected to the collector of the transistor Q12 but to the power source of GND.

Figure 9:
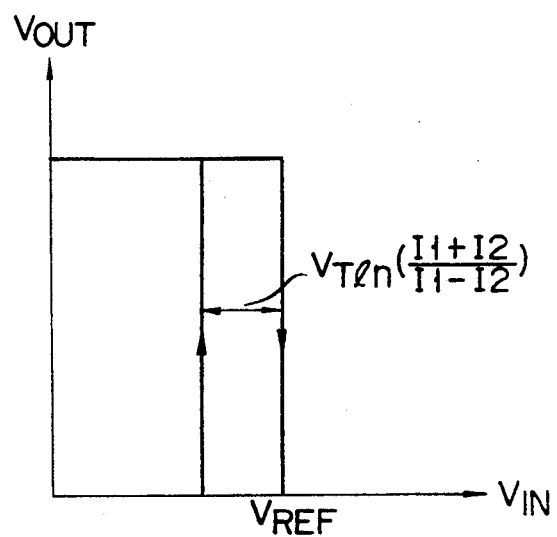
FIG. 9 is a graph showing an operation of the circuit according to the fourth embodiment of the present invention.

With the above arrangement, according to input/output characteristics shown in FIG. 9, a threshold level $V_{THU}$ of the input voltage $V_{IN}$ when the input voltage $V_{IN}$ is switched from "L" level to "H" level is equal to the reference voltage $V_{REF}$. Therefore, in the circuit of this embodiment, a Schmitt width of $-V_T \ln\{(I1+I2)/(I1-I2)\}$ can be obtained with respect to the reference voltage $V_{REF}$.

According to the voltage comparator of the preferred embodiment of the present invention, a small Schmitt width can be accurately set with a simple circuit structure.

What is claimed is:

1. A voltage comparator comprising: a differential amplifier including
   a first transistor, of a first polarity, having a base, a first collector means, and a first emitter means, and
   a second transistor, of the first polarity, having a base, a second collector means, and a second emitter means coupled to the first emitter means;
   a first constant current source coupled between the first emitter means and a first reference source, the first constant current source having a first current value;
   a third transistor of a second polarity having a collector emitter path coupled between the first collector means and a second reference source;
   a fourth transistor of the second polarity having a collector-emitter path coupled between the second collector means and said second reference source;
   a first switching element having a first terminal, coupled to the first collector means, and a second terminal;
   a second switching element having a first terminal, coupled to the second collector means, and a second terminal, coupled to the second terminal of said first switching element;
   a second constant current source coupled between the second terminal of said first switching element and said first reference source and having a current value smaller than the first current value;
   a buffer amplifier for receiving an output of said differential amplifier and generating an output signal; and
   control means for selectively controlling said first and second switching elements to be turned on in accordance with the output signal from said buffer amplifier.

2. A voltage comparator according to claim 1, wherein the first switching element includes
   a first MOS transistor, of a first channel type, having a first gate, and a source-drain path having one end coupled to the first collector means and another end coupled to the second constant current source, and wherein the second switching element includes
   a second MOS transistor, of the first channel type, having a second gate, and a source-drain path having one end coupled to the second collector means and another end coupled to the second terminal of the first switching element.

3. A voltage comparator according to claim 2, wherein the control means includes
   means for generating an inversion signal of the output signal generated by the buffer amplifier and for applying the inversion signal to one of the first and second gates.

4. A voltage comparator, adapted to receive first and second reference sources, the voltage comparator comprising:
   a differential amplifier including
      a first transistor, of a first polarity, having a base, a first collector means, and a first emitter means, and
      a second transistor, of the first polarity, having a base, a second collector means, and a second emitter means coupled to the first emitter means;
   a first constant current source coupled between the first emitter means and a first reference source, the first constant current source having a first current value;
   a third transistor of a second polarity having a collector-emitter path coupled between the first collector means and a second reference source;
   a fourth transistor of the second polarity having a collector-emitter path coupled between the second collector means and the second reference source;
   a first switching element having a first terminal and a second terminal;
   a second switching element having a first terminal and a second terminal, the second terminal being coupled to the second terminal of the first switching element;
   a second constant current source coupled between the second terminal of the first switching element and the first reference source and having a current value smaller than the first current value;
   a buffer amplifier for receiving an output of the differential amplifier and generating an output signal; and
   control mans for selectively controlling the first and second switching elements to be turned on in accordance with the output signal from the buffer amplifier.

5. A voltage comparator according to claim 4, wherein the first terminal of the firs switching element is coupled to the first collector means.

6. A voltage comparator according to claim 4, wherein the first terminal of the first switching element is coupled to the second reference source.

7. A voltage comparator according to claim 4, wherein the control means includes
   means, responsive to the output of the differential amplifier, for turning on one of the first and second switching elements, in the alternative.

8. A voltage comparator, adapted to receive first and second reference sources, the voltage comparator comprising:
   a differential amplifier including
      a first transistor, of a first polarity, having a base, a first collector means, and a first emitter means,
      a second transistor, of the first polarity, having a base, a second collector means, and a second emitter means coupled to the first emitter means,
      a third transistor, of the first polarity, having a base coupled to the first collector means, a third collector means coupled to the second reference source, and a third emitter means, and
      a fourth transistor, of the first polarity, having a base coupled to the second collector means, a fourth collector means coupled to the second reference source, and a fourth emitter means;
   a first constant current source coupled between the first emitter means and a first reference source, the first constant current source having a first current value;

a fifth transistor of a second polarity having a collector-emitter path coupled between the first collector means and a second reference source;

a sixth transistor of the second polarity having a collector-emitter path coupled between the second collector means and the second reference source;

a first switching element having a first terminal and a second terminal;

a second switching element having a first terminal and a second terminal, the second terminal being coupled to the second terminal of the first switching element;

a second constant current source coupled between the second terminal of the first switching element and the first reference source and having a current value smaller than the first current value;

a buffer amplifier for receiving an output of the differential amplifier and generating an output signal and control means for selectively controlling the first and second switching elements to be turned on in accordance with the output signal from the buffer amplifier.

9. A voltage comparator according to claim 8, wherein the first terminal of the first switching element is coupled to the first collector means.

10. A voltage comparator according to claim 8, wherein the first terminal of the first switching element is coupled to the second reference source.

11. A voltage comparator according to claim 8, wherein the control means includes means, responsive to the output of the differential amplifier, for turning on one of the first and second switching elements, in the alternative.

12. A voltage comparator according to claim 8, wherein a size of the third transistor is the same as a size of the first transistor, and a size of the fourth transistor is the same as a size of the second transistor.

* * * * *

UNITED STATES PATENT AND TRADEMARK OFFICE
CERTIFICATE OF CORRECTION

PATENT NO. : 5,162,671
DATED : November 10, 1992
INVENTOR(S) : Ichiro Ishihara

It is certified that error appears in the above-identified patent and that said Letters Patent is hereby corrected as shown below:

Claim 1, column 7, line 27, change "tor emitter" to --tor-emitter--.

Claim 8, column 10, line 2, after "signal" insert --;--.

Signed and Sealed this

Twenty-first Day of December, 1993

Attest:

BRUCE LEHMAN

*Attesting Officer*     Commissioner of Patents and Trademarks